(12) United States Patent
Strobl

(10) Patent No.: US 7,696,429 B2
(45) Date of Patent: Apr. 13, 2010

(54) SOLAR CELL WITH INTEGRATED PROTECTIVE DIODE

(75) Inventor: Gerhard Strobl, Stuttgart (DE)

(73) Assignee: Azur Space Solar Power GmbH, Heilbronn (DE)

( * ) Notice: Subject to any disclaimer, the term of this patent is extended or adjusted under 35 U.S.C. 154(b) by 633 days.

(21) Appl. No.: 11/596,185

(22) PCT Filed: May 10, 2005

(86) PCT No.: PCT/EP2005/005013

§ 371 (c)(1),
(2), (4) Date: Nov. 13, 2006

(87) PCT Pub. No.: WO2005/112131

PCT Pub. Date: Nov. 24, 2005

(65) Prior Publication Data

US 2007/0256730 A1    Nov. 8, 2007

(30) Foreign Application Priority Data

May 12, 2004  (DE) ....................... 10 2004 023 856

(51) Int. Cl.
*H01L 31/042* (2006.01)
(52) U.S. Cl. .................................................. 136/249
(58) Field of Classification Search .......... 136/243–246
See application file for complete search history.

(56) References Cited

U.S. PATENT DOCUMENTS

| 6,316,716 | B1 | 11/2001 | Hilgrath |
| 6,359,210 | B2 * | 3/2002 | Ho et al. ...................... 136/256 |
| 6,586,669 | B2 * | 7/2003 | King et al. ................... 136/249 |
| 6,635,507 | B1 | 10/2003 | Boutros et al. |
| 2002/0117675 | A1 | 8/2002 | Mascarenhas |
| 2002/0144724 | A1 | 10/2002 | Kilmer et al. |

FOREIGN PATENT DOCUMENTS

WO    0044052    7/2000

OTHER PUBLICATIONS

Stan et al. "The development of >28% Efficient Triple-Junction Space Solar Cells at Emcore Photovoltaics", May 2003, Proc. of 3$^{rd}$ World Conf. On Photovoltaic Energy Conversion Bd. 1,11.5, pp. 663-663.

* cited by examiner

*Primary Examiner*—Jessica L. Ward
*Assistant Examiner*—Kevin E Yoon
(74) *Attorney, Agent, or Firm*—Dennison, Schultz & MacDonald

(57) ABSTRACT

The invention relates to a solar cell which comprises photoactive semiconductor layers extending between the front and the back contact, and an integrated protective diode (bypass diode), said protective diode having a polarity opposite to that of the solar cell and is provided at its front with a p-conducting semiconductor layer, and the protective diode is connected to the front contact. The aim of the invention is to provide a highly stable protective diode and to prevent a migration of metal atoms. For this purpose, a tunnel diode (38) extends on the p-conducting semiconductor layer (36) of the protective diode (32), said tunnel diode being connected to the front contact (14) via an n$^+$ layer.

11 Claims, 2 Drawing Sheets

US 7,696,429 B2

SOLAR CELL WITH INTEGRATED PROTECTIVE DIODE

This application is a 371 of PCT/EP2005/005013 filed on May 10, 2005.

The invention relates to a solar cell with photoactive semiconductor layers extending between front and rear contacts, with an integral protective diode (bypass diode), which is connectable to the front contact, with a polarity opposite to the solar cell, and a p-conducting semiconductor layer on its front side, on which extends a tunnel diode.

In large-surface-area diodes with surface areas of several square centimeters, such as these solar cells of semiconductor material with at least one p/n junction. form, microshorts, i.e. local small-dimensional electrical (ohmic) connections across the p/n junction layer of the semiconductor material are often unavoidable. These are produced, for example, by surface damage suffered during the substrate production, in the crystal or as a result of doping agent accumulations, for example at crystal imperfections, such as dislocations, in particular during the formation of epitaxial p/n junctions in, for example, solar cells with elements of Groups III-V of the Periodic System.

Under normal circumstances, the microshorts developing in this manner barely, or only to a small extent, interfere with the performance of the diode as a solar cell in the forward direction. However, during operation of the cell in the reverse direction, these defects can result in the destruction of the cell. For example, if several solar cells or solar generators are connected in series in a so-called string in a solar array, then in the event of a blocked p/n junction of a generator—this may be caused by for example shading or breaking of the solar cell—the solar-power current is forced through the ohmic microshorts by the high string voltage of the remaining illuminated solar cells or solar generators. This can lead to strong local heating, to redoping to low ohmic resistance, i.e. local strong degeneration of the semiconductor, and finally to destruction of the cell itself.

For the purpose of preventing the corresponding local strongly heated areas, so-called hot spots, it is known, for solar cells connected in series, to arrange protective diodes in parallel to the solar cells, with a flow direction opposite to that of the solar cells.

An example of a cascade or multi-junction solar cell with an integrated protective diode of the above-mentioned type can be found in WO-A-00/44052.

From EP-A-1 056 137 there is known a solar cell in which, in some regions, the protective-diode semiconductor layer is formed by a layer of the solar cell itself, the photoactive layers extending at a distance from the region of the solar cell which forms the protective-diode semiconductor layer. The protective diode may be embodied as a Schottky diode, an MIS diode, a diode with p/n junction, or as a metal alloy diode.

Further solar cells with integrated protective diodes can be found in US-A-2002/0179141, U.S. Pat. No. 6,600,100, or U.S. Pat. No. 6,359,210. These solar cells are so-called cascade solar cells, in which several solar cells are arranged one above the other and are separated by tunnel diodes. The solar cell is n/p type and consequently the protective diodes is a p/n type semiconductor. Hence, the semiconductor layer on the front contact side is a hole conductor, which results in a migration of the metal atoms of the front contact, which renders the diode unstable. Increased migration occurs, particularly, in cases where the front contact contains silver.

The present invention is based on the problem of further developing a solar cell of the first-mentioned type in such a way so that a high stability of the protective diode is ensured, i.e. in particular a migration of metal atoms is entirely or at least to a large degree prevented.

According to the invention, this problem is solved, essentially, by an $n^+$-conducting layer, which extends on the tunnel diode, via which the protective diode is connected or connectable to the front contact.

According to the invention, the protective diode is further developed in such a way that an n-layer, i.e. an electron-conducting layer, extends below the contact region (metallization), which is connected in a suitable manner to the front contact of the photoactive region of the solar cell, resulting in a prevention of migrations without affecting the functionality of the protective diode.

In particular, the invention provides that the solar cell is a cascade solar cell or a multi-junction solar cell with n sub solar cells, where $n \geq 2$. In other words, the solar cell can contain a desired number of p/n junctions. In particular, the solar cell is embodied as a triple cell with first, second, and third n/p-type sub solar cells arranged one above the other, a tunnel diode extending between the respective sub solar cells, so that the solar cell is subdivided into a photoactive first region and a second region, having the protective diode on its front side, with semiconducting layers that extend at a spacing from the photoactive first region, which extends from a common substrate.

In this, the sub solar cells are designed to absorb radiation of different wavelengths. For example, the first or bottom cell may be a germanium solar cell, on top of which extends a centre cell according to the type $Ga_{1-x}In_xAs$, where e.g. $0.01 \leq x \leq 0.03$. The front preferably is provided with a $Ga_{1-y}In_yP$ type cell, whereby preferably $0.48 \leq y \leq 0.51$.

The respective solar cells are capable of absorbing radiation in the wavelength bands 900-1800 nm (bottom cell), 660-900 nm (centre cell), and 300-660 nm (front or top cell).

Independently thereof, it is particularly intended that the protective diode consists of an n-layer extending on the solar-cell side and a p-conducting layer extending along the front side, which consist comprises $Ga_{1-x}In_xAs$, where e.g. $0.01 \leq x \leq 0.03$ and $Ga_{1-y}In_yP$, where $0.48 \leq y \leq 0.51$, respectively. Furthermore, the $p^{++}$-conducting layer of the tunnel diode may for example comprise $Al_{1-y}Ga_yAs$, where e.g. $0.0 \leq y \leq 0.6$ and/or the $n^{++}$-conducing layer of the tunnel diode may consist of $Ga_{1-x}In_xAs$, where e.g. $0.01 \leq x \leq 0.03$. Corresponding layers using an AlGaInP material system are also conceivable.

Independently of this, it should be noted that the layers of the protective diode should consist of a material system which corresponds to that of the solar cell or that of one of the sub solar cells in a cascade solar cell or a multi-junction solar cell.

Further details, advantages, and features of the invention can be found not only in the claims, the features specified therein—on their own and/or in combination—but also in the following description of a preferred exemplary embodiment shown in the drawing.

Figure 1:
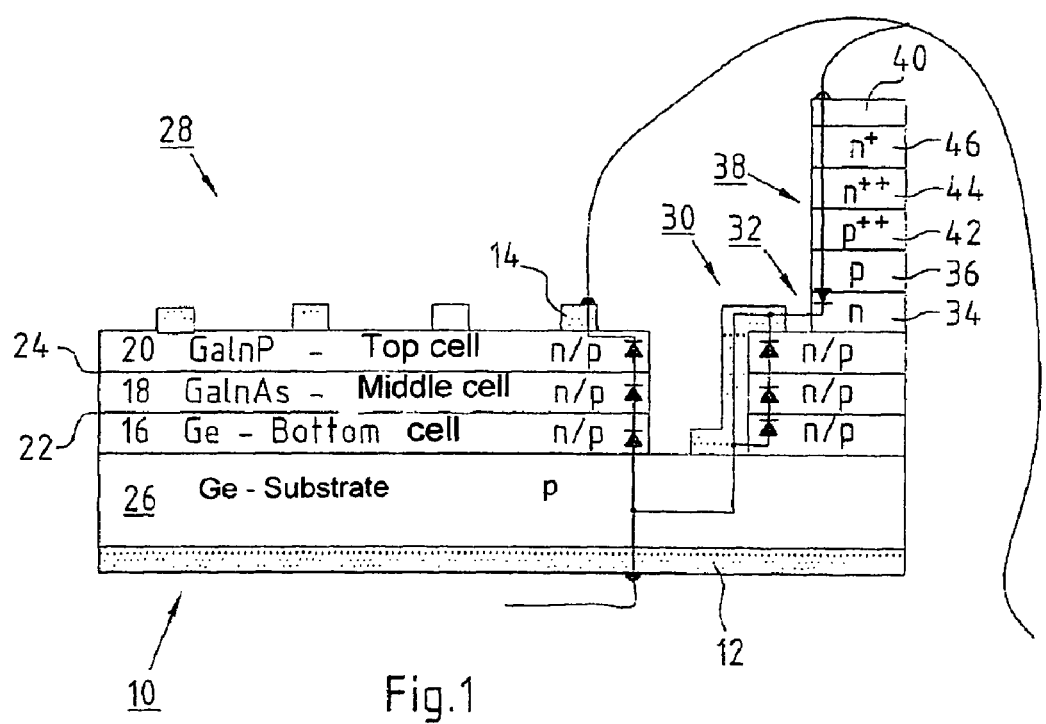
FIG. 1 shows a schematic drawing of a triple cell with protective diode.

FIG. 1 shows a purely schematic illustration of a cascade or multi-junction solar cell, which comprises a rear contact 12 and a front contact 14. Altogether three cells 16, 18, 20, which are separated from each other by tunnel diodes 22, 24, are arranged between the rear contact 12 and the front contact 14 on a germanium substrate 14, which can be p-conducting monocrystalline germanium.

The base or bottom cell 16 is arranged on a germanium substrate 26. The emitter of the n-conducting germanium bottom cell 16 is incorporated into the germanium substrate 26, which is p-conducting, by diffusion of arsenic or phosphorus. In this, the p-conducting substrate is already the photoactive layer of the base or bottom cell 16. Subsequently, the first tunnel diode 22 is epitaxially deposited, onto which, furthermore, the centre cell 18 is deposited. During this, a lattice matching relative to the germanium must be effected. The centre cell therefore preferably comprises gallium arsenide (GaAs), which however possesses a slightly different lattice constant than germanium. For this reason, one preferably adds 1-3% indium to match the lattice constants to each other. Subsequently, the tunnel diode 20 is epitaxially deposited onto the centre cell 18.

The front or top cell 20 consists of gallium indium phosphide. Indium is added to effect another lattice adjustment, whereby one preferably chooses a composition of, in particular, $Ga_{0.51}In_{0.49}P$.

Corresponding solar cells 10 are usually connected in series to form a string.

Existing microshorts in the active semiconductor layers can lead to destruction of the cell during operation of the cell 10 in the reverse direction. As protection against such destruction, a protective diode is connected in parallel to the solar cell 10. For this purpose, according to the teaching of EP-A-1 056 137, a small region of the photoactive layers, i.e. the bottom cell 16, the centre cell 18, and the top cell 20, as well as the tunnel diodes 22, 24 extending between these, can be removed down to the substrate, for example by local vertical etching. Subsequently, a p/n type protective diode 32 is epitaxially deposited onto the region 30 of the solar cell 10 that extends at a spacing from the photoactive region 28 on the substrate 12, the n-type layer 34 extending on the top-cell side and the p-type layer 36 extending on the front side.

The layers 34, 36 can be lattice-adjusted relative to each other or relative to the adjoining layers. It is, however, also possible to select the composition of the materials of the individual layers in a way that results in a lattice-mismatched system.

According to the invention, a tunnel diode 38 is subsequently epitaxially deposited onto the p-layer 36 of the protective diode, which preferably matches the material of the centre cell 18 or the top cell 20, i.e. gallium indium arsenide or gallium indium phosphide, whereby the $p^{++}$ layer 42 on the protective-diode side preferably consists of AlGaAs or AlGaInP and the $n^{++}$ layer 44 on the front side preferably consists of GaInAs or GaAs or InGaP. The correspondingly structured tunnel diode 38 has a very good tunnelling characteristic up to the very high current densities which are present in the bypass diode 32 (up to 550 mA at approximately 8 $mm^2$).

Subsequently, a front contact 40 can be applied directly to the $n^{++}$ front-side layer 44 of the tunnel diode 38. However, an additional $n^+$ contact layer 46 is preferably provided, as is also intended in the photoactive region 28 of the solar cell 10.

Preferably, for the formation of the solar cell 10, all layers, i.e. including the protective diode 32 and the tunnel diode 38 as well as the additional $n^+$ contact layer 46, are firstly formed or epitaxially deposited in order to subsequently separate the photoactive region 28, by vertical etching, from the region 30, on which the protective diode 32 extends with the tunnel diode 38 and the contact layer 46.

In FIG. 1 there is further shown a schematic circuit diagram of the solar cell 10, which is to be connected in series with other solar cells. The equivalent circuit diagram illustrates how the protective diode 32 is connected in anti-parallel to the solar cell 10.

Figure 2:
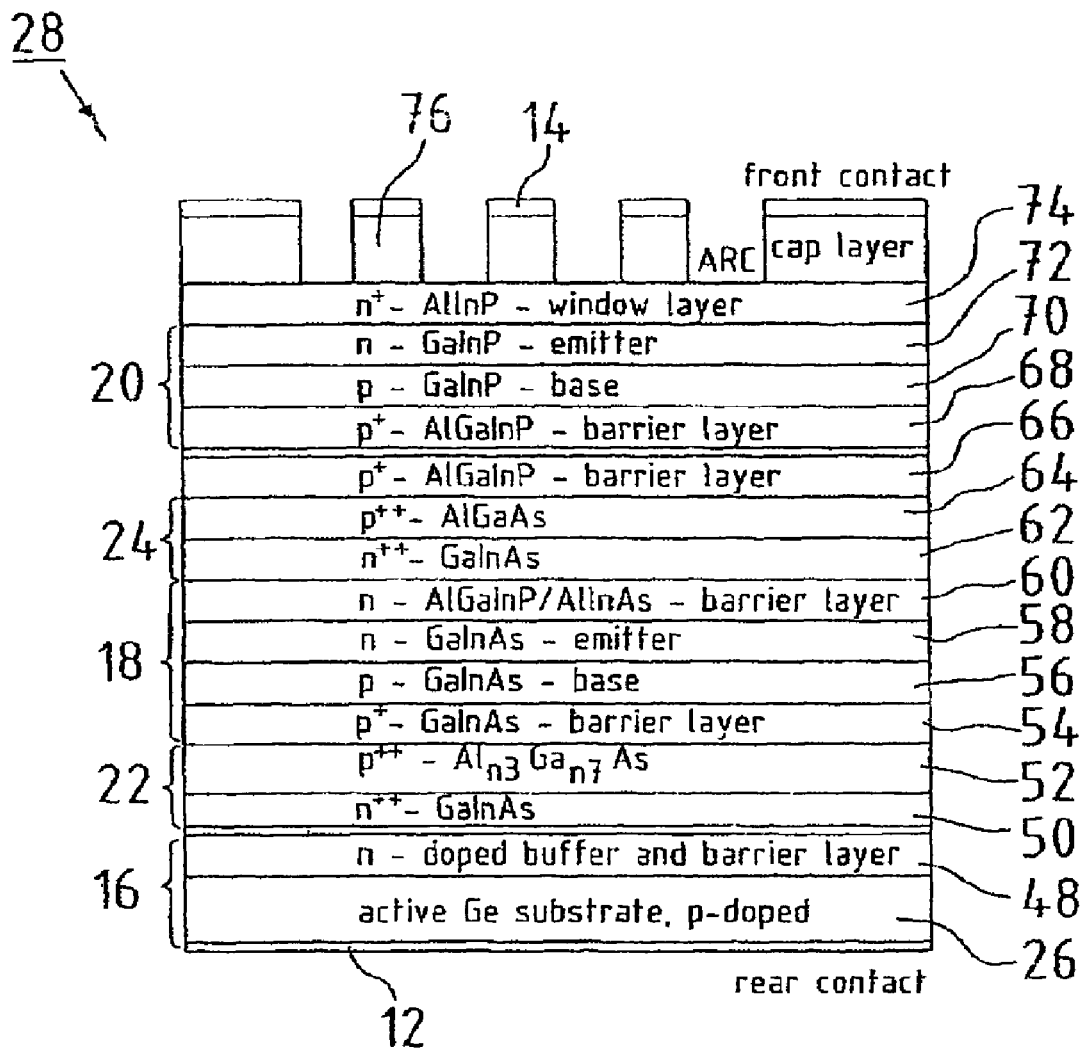
FIG. 2 shows the structure of the photoactive region of a triple cell.

FIG. 2 illustrates in more detail the structure of the active region 28 of the triple cell 10, which corresponds to the subregion 30 below the protective diode 32.

The base or bottom cell 16, which is composed of the p-doped active germanium substrate 26 and of the p-doped buffer layer 48 extending thereon, as well as the barrier layer, is applied onto the rear contact 12. Subsequently, an $n^{++}$ gallium indium arsenide (GaInAs) layer 50 or GaAs layer or InGaP layer is applied onto the buffer and barrier layer 48, and onto this is applied a $p^{++}$ $Al_{0.3}Ga_{0.7}As$ layer 52, which form the tunnel diode 22. Onto the tunnel diode 22 are subsequently applied the centre cell 18, which consists of a $p^+$-conducting barrier layer 54 of GaInAs, a p-conducting base layer 56 of GaInAs, and an n-conducting emitter layer 58 of GaInAs. The indium proportion is chosen to effect a lattice adjustment relative to the layers forming the tunnel diode 22 and to the Ge substrate. The indium portion preferably is between 1% and 3%.

The centre cell 18 can then be covered by an $n^+$-conducting barrier layer 60, which can comprise AlGaInP/AlInAs.

From the centre cell 18 extends the tunnel diode 24, comprising the $n^{++}$-conducting lower layer 62 of GaInAs or AlGaInP and the $p^{++}$-conducting upper layer 64 of AlGaAs or AlGaInP. This tunnel diode preferably consists of material with large band separation to ensure adequate light transmission for the underlying solar cells. This tunnel diode can then be covered by a barrier layer 66, which is $p^+$-conductive and consists of AlGaInP.

Onto the tunnel diode is epitaxially deposited the front or top cell 20, which consists of a $p^+$-conducting barrier layer 68 of GaInP, a base layer 70 that is p-conductive and consists of GaInP, and an n-conducting emitter layer 72 of GaInP. The emitter layer 72 is covered by a window layer 74, which is $n^+$-conductive and consists of AlInP. Because the window layer 74 is difficult to connect to the front contact 14, an n-conducting cap layer 76 consisting of n-GaAs extends over sections of the window layer 74.

With respect to the material of the protective diode, preferably the same material is chosen as that used in the centre cell 18, namely GaAs with some In. One could, in principle, also use the same material as in the front or top cell 30, i.e. GaInP. However, in that case the forward voltage of the protective diode 32 would be higher.

The material of the tunnel diode 38 extending on the protective diode 32 should be the same as that of the tunnel diode 22 on account of the good tunnelling characteristics, i.e. the $p^{++}$-conducting layer 42 should consist of $Al_{0.3}Ga_{0.7}As$ and the $n^{++}$-conducting layer 44 should consist of GaInAs.

The front contact 40 covering the $n^+$-layer is then connected in an electrically conductive manner to the front contact 14 of the photoactive region 28 on the one hand and to the rear contact of a further series-connected solar cell on the other hand. This usually takes place during the connecting of solar cells by soldering or welding on a standard connector, as it is also used for solar cells without protective diode, one of several welding regions usually being formed as protective diode. The protective diode can also be already integrally connected in the solar cell.

The invention claimed is:

1. A solar cell, comprising:
   photoactive semiconductor layers with a front surface and a back surface, the front surface being the illuminated side of the solar cell when the solar cell is in the active state;
   a front contact on the front surface and a rear contact on the back surface;

an integrated protective diode, which is connectable to the front contact, with a polarity opposite to the solar cell, on the front surface, the protective diode having a p-type layer on a front portion of the protective diode;

a tunnel diode on the p-type layer of the protective diode;

an $n^+$-type layer on the tunnel diode, wherein the protective diode is connected or connectable to the front contact via the $n^+$-type layer.

2. A solar cell according to claim 1 wherein the protective diode comprises an n-type layer on the front surface of the photoactive semiconductor layers, and the p-type layer on the n-type layer, which each comprise GaInAs or GaInP.

3. A solar cell according to claim 1 wherein a $p^{++}$-type layer of the tunnel diode comprises AlGaAs such as $Al_{1-y}Ga_yAs$, where $0.0 \leq y \leq 0.6$.

4. A solar cell according to claim 1 wherein an $n^{++}$-type layer of the tunnel diode comprises GaInAs, such as $Ga_{1-x}In_xAs$, where $0.01 \leq x \leq 0.03$, or of GaAs or of InGaP.

5. A solar cell according to claim 1 wherein the solar cell is a cascade or multi-junction solar cell, in particular in the form of a triple cell with first, second, and third sub solar cell of n/p type arranged one above the other.

6. A solar cell according to claim 5 wherein photoactive semiconductor layers of the first sub cell or bottom cell comprise germanium.

7. A solar cell according to claim 5 wherein photoactive semiconductor layers of the second sub cell or centre cell comprise $Ga_{1-x}In_xAs$, where $0.01 \geq x \geq 0.03$.

8. A solar cell according to claim 5 wherein photoactive semiconductor layers of the third sub cell or top cell comprise $Ga_{1-z}In_zP$, where $0.48 \geq z \geq 0.52$.

9. A solar cell according to claim 1 wherein the solar cell comprises a photoactive first region and a second region having the protective diode on its front side, the first region and the second region extending from a common substrate at a spacing from one another.

10. A solar cell according to claim 1 wherein the layers of the protective diode comprise materials that correspond to those of the layers of one of the sub solar cells of the cascade or multi-junction solar cells.

11. A solar cell according to claim 1 wherein the $n^+$-type layer connecting the protective diode to the front contact of the solar cell is covered by a metallic contact which is connected to the front contact of the photoactive layers of the solar cell.

* * * * *